United States Patent
Smith et al.

(10) Patent No.: US 10,388,587 B1
(45) Date of Patent: Aug. 20, 2019

(54) QUANTUM MOLECULAR BASED THERMAL INTERFACE MATERIAL

(71) Applicant: RAYTHEON COMPANY, Waltham, MA (US)

(72) Inventors: David R. Smith, Tucson, AZ (US); William C. Mollberg, Marana, AZ (US); Daniel P. Feeney, Tucson, AZ (US); Ky Mickelsen, Tucson, AZ (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/106,618

(22) Filed: Aug. 21, 2018

(51) Int. Cl.
*C08F 4/10* (2006.01)
*C08G 81/02* (2006.01)
*H01L 23/373* (2006.01)
*H05B 33/08* (2006.01)

(52) U.S. Cl.
CPC ............ *H01L 23/3738* (2013.01); *C08F 4/10* (2013.01); *C08G 81/021* (2013.01); *H01L 23/3736* (2013.01); *H05B 33/0803* (2013.01)

(58) Field of Classification Search
CPC ............ H01L 23/3738; H01L 23/3736; H05B 33/0803; C08F 4/10; C08G 81/021
See application file for complete search history.

(56) References Cited

U.S. PATENT DOCUMENTS

| | | | |
|---|---|---|---|
| 9,085,719 B2* | 7/2015 | Boday | ................ H01L 23/3737 |
| 9,873,774 B1* | 1/2018 | Kuczynski | ............... C08K 3/22 |
| 2007/0262421 A1* | 11/2007 | Lehman, Jr. | .......... H01L 21/563 257/642 |
| 2012/0182693 A1* | 7/2012 | Boday | ..................... C09K 5/14 361/713 |
| 2012/0261064 A1* | 10/2012 | Boday | ................ H01L 23/3737 156/247 |
| 2014/0039136 A1* | 2/2014 | Dikic | ................... C08G 59/022 525/526 |
| 2014/0087200 A1* | 3/2014 | Arora | ..................... C08L 25/06 428/523 |
| 2014/0262192 A1* | 9/2014 | Boday | ................ H01L 23/3737 165/185 |
| 2016/0326419 A1* | 11/2016 | Balandin | .................. C08K 3/04 |
| 2018/0056598 A1* | 3/2018 | Kuczynski | .......... B29C 35/0805 |

OTHER PUBLICATIONS

Sumanjeet Kaur, "Enhanced thermal transport at covalently functionalized carbon nanotube array interfaces", Nature Communications | 5:3082 | DOI: 10.1038/ncomms4082 |www.nature.com/naturecommunications, Published Jan. 22, 2014, 8 pages.
Dr. Craig Green, CTO Carbice Nanotechnologies, Inc., "A Versatile, Easy to Apply Product for Heat Dissipation: The Second Coming of Carbon Nanotubes", Semicon West Jul. 12-14, 2016, Moscone Center San Fransico, CA, 13 pages.

* cited by examiner

*Primary Examiner* — Victor A Mandala
(74) *Attorney, Agent, or Firm* — Cantor Colburn LLP

(57) ABSTRACT

A thermal interface structure includes a first surface including a surface of a heat generating device, a first surface binding polymer bonded to the first surface, a second surface including a surface of a heat sink, and a second surface binding polymer bonded to the second surface. The first surface binding polymer and the second surface binding polymer cross-link to one another to form a covalently bonded, cross-linked section that creates a thermal interface material that forms a continuous molecular connection between the first surface and the second surface.

20 Claims, 4 Drawing Sheets

QUANTUM MOLECULAR BASED THERMAL INTERFACE MATERIAL

BACKGROUND

The present disclosure generally relates to thermal interface materials (TIMs), and more specifically to quantum molecular based TIMs.

Thermal transport limits the reliability and performance of electronic devices. In many advanced technologies, such as micro- and nano-electronics, optoelectronics, micro-electro-mechanical systems, photovoltaic systems, and electrochemical batteries, technology is driven by size, weight, and power considerations. As devices have become progressively smaller, more powerful, and more complex, they dissipate much larger amounts of heat per unit area.

Cooling systems, or heat sinks, are coupled to heat generating devices to aid in thermal transport. However, the dissipated heat can erode the device when there is not a TIM between the device and cooling system. TIMs include thermal materials that enable efficient heat dissipation, including, for example, macro fibers of carbon, carbon nanotubes, or highly filled (fillers include, for example, metal particles or metal oxides such as aluminum oxide) organic materials, such as greases and solders.

SUMMARY

According to one or more embodiments, a thermal interface structure includes a first surface including a surface of a heat generating device, a first surface binding polymer bonded to the first surface, a second surface including a surface of a heat sink, and a second surface binding polymer bonded to the second surface. The first surface binding polymer and the second surface binding polymer cross-link to one another to form a covalently bonded, cross-linked section that creates a thermal interface material that forms a continuous molecular connection between the first surface and the second surface.

According to other embodiments, a thermal interface structure includes a first surface including a surface of a heat generating device and a first surface binding block copolymer bonded to the first surface. The first surface binding block copolymer includes a first surface binding functional group bonded to the first surface and a first cross-linker block. The thermal interface structure further includes a second surface including a surface of a heat sink and a second surface binding block copolymer bonded to the second surface. The second surface binding block copolymer includes a second surface binding functional group bonded to the second surface and a second cross-linker block. The first cross-linker block and the second cross-linker block cross-link to one another to form a covalently bonded, cross-linked section that forms a continuous molecular connection between the first surface and the second surface.

Yet, according to other embodiments, a method for forming a thermal interface material includes bonding a first surface binding polymer to a first surface including a surface of a heat generating device. The method further includes bonding a second surface binding polymer to a second surface including a surface of a heat sink. The method also includes reacting the first surface binding polymer with the second surface binding polymer to form a covalently bonded, cross-linked section that forms a continuous molecular connection between the first surface and the second surface.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Turning now to an overview of technologies that are more specifically relevant to aspects of the invention, the limiting factor in power of electronic devices with high power densities is the thermal conduction of the TIM, which is dependent on intermolecular collision. Current TIMs that employ highly filled greases and solders, for example, have a thermal conductivity that is limited by macro-interfaces between materials.

Turning now to an overview of the aspects of the invention, one or more embodiments of the invention address the above-described shortcomings of the prior art by providing methods for synthesizing and implementing TIM structures which allow a path for thermal conductance that is achieved via intramolecular vibrations and thus occurs through the molecular bonds. The TIM structures are chemically anchored at each end to a heat sink and a heat generating device to provide a continuous path (or a continuous molecular connection) along a single polymer backbone, facilitating intramolecular heat transfer from the heat generating device to the heat sink. The structures formed can increase the thermal conductivity of TIM structures by several orders of magnitude, for example, 1 to 3 orders or magnitude in some embodiments of the invention.

The above-described aspects of the invention address the shortcomings of the prior art by providing a TIM that provides intramolecular heat transfer from a heat generating device to a heat sink, as opposed to only lower efficiency intermolecular heat transfer that relies on molecular collisions, which occur in any system. Compared to conventional TIMs, which are intelligently designed to allow for large thermal conductance by using metal fillings that aid in moving heat, the inventive systems include less metal and enable both intra- and intermolecular heat transfer. The single layer of polymer molecules eliminates the macro-interfaces present in other TIMs that rely solely on molecular collision for thermal conductivity.

Figure 1:
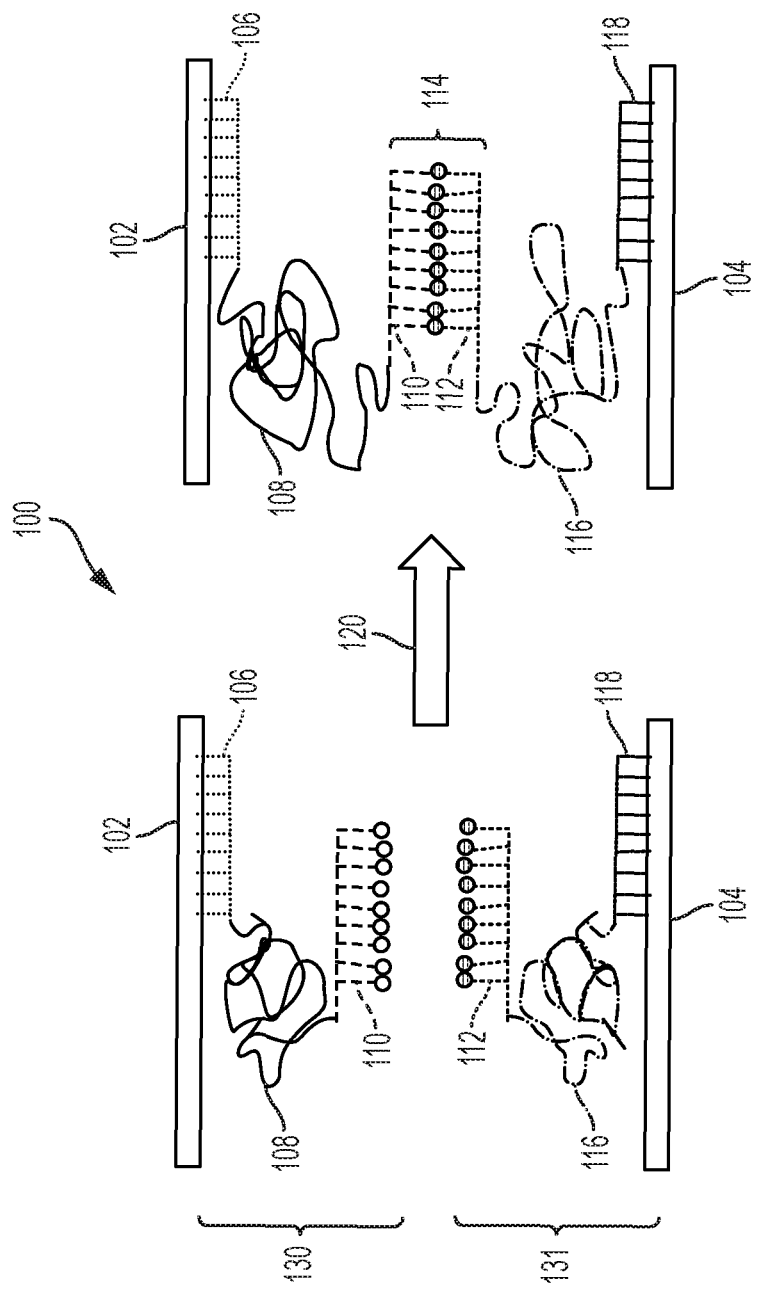
FIG. 1 illustrates a method of coupling surfaces with a cross-linked thermal interface material (TIM) according to embodiments of the invention.

Turning now to a more detailed description of aspects of the present invention, FIG. 1 illustrates a method 100 of coupling surfaces with a cross-linked TIM according to embodiments of the invention. The cross-linked TIM is formed between a first surface 102 and a second surface 104. The first surface 102 includes a surface of a heat generating device, such as an electronic device, and the second surface 104 includes a surface of a heat sink. The first surface 102 of the electronic device includes any types of materials, including, but not limited to, metals, glass, dielectric materials, and semiconductor materials. The second surface 104 of the heat sink includes a passive heat exchanger that transfers the heat generated by an electronic or a mechanical device to a fluid medium, often air or a liquid coolant, where it is dissipated away from the device, thereby allowing regulation of the device's temperature at optimal levels. In computers, heat sinks are used to cool central processing units or graphics processors. Heat sinks are used with high-power semiconductor devices, such as power transistors and optoelectronics such as lasers and light emitting diodes (LEDs), where the heat dissipation ability of the component itself is insufficient to moderate its temperature.

The cross-linked TIM will be formed from a first block copolymer 130 and a second block copolymer 131. The first copolymer 130 includes a first surface binding block 106, a first flexible block 108, and a first cross-linker block 110. The second copolymer 131 includes a second surface binding block 118, a second flexible block 116, and a second cross-linker block 112. Although the first block copolymer 130 and the second block copolymer 131 include three blocks (a tri-block copolymer) in the embodiments described, the first copolymer 130 and the second copolymer 131 can include any number of blocks, for example, one block, two blocks, four blocks, five blocks, six blocks, or more. The first block copolymer 130 and the second block copolymer 131 can be formed by any known polymerization method. According to one or more embodiments, reversible addition-fragmentation chain-transfer (RAFT) polymerization can be used to form the block copolymers.

The first surface binding block 106 and the second surface binding block 118 each include a polymer that is functionalized with a functional group that can chemically bond to the respective first surface 102 and second surface 104. The type of functional group therefore depends on composition of the first and second surfaces 102, 104. The functional groups of the first surface binding block 106 and second surface bonding block 118 are the same in some embodiments, and different in other embodiments.

According to one or more embodiments, the first surface 102 and/or the second surface 104 includes gold, and the first surface binding block 106 and/or the second surface binding block 118 includes a thiol functional group, forming a gold-thiol reaction product.

According to one or more embodiments, the first surface 102 and/or the second surface 104 includes an inorganic material(s), e.g., glass, metal, or semiconductor, and the first surface binding block 106 and/or the second surface binding block 118 includes a silane coupling agent. Silane coupling agents include organosilane compounds having at least two reactive groups of different types bonded to a silicon atom. The first reactive group, e.g., methoxy, ethoxy, or silanolic hydroxyl, is reactive with the inorganic surface material, and the second reactive group, e.g., vinyl, epoxy, methacryl, amino, or mercapto, is reactive with the organic polymer portion of the first surface binding block 106 and/or the second surface binding block 118.

The first flexible block 108 and the second flexible block 116 each include a polymer or copolymer. According to one or more embodiments, the first flexible block 108 and the second flexible block 116 are the same. The added length provided by the first flexible block 108 and the second flexible block 116 allows the polymers to extend between the first surface 102 and the second surface 104. Yet, according to other embodiments, the first flexible block 108 and the second flexible block 116 are different. A non-limiting example of a flexible block that can be used for the first flexible block 108, the second flexible block 116, or both, include poly(methyl methacrylate) (PMMA).

The first cross-linker block 110 includes a first cross-linking functional group that is complementary to a second cross-linking functional group of the second cross-linker block 112. The complementary functional groups will covalently bond to one another by cross-linking to couple the first copolymer 130 to the second copolymer 131 and form a cross-linked section 114 that creates an intramolecular TIM, with a continuous layer of polymer molecules that transfers heat intramolecularly from the first surface 102 to the second surface 104. The continuous layer of polymer molecules does not include macro-interfaces present in other TIMs that solely rely on intermolecular collisions for heat transfer; although, some intermolecular heat transfer will also occur in the inventive systems.

The cross-linked section 114 produces a single layer of material capable of intramolecular heat transfer between the first surface 102 and the second surface 104. The intramolecular heat transfer path over-shadows the intermolecular transfer of heat in the TIM, which is the fundamental limiting factor in thermal conduction. The theoretical thermal conductivity of the intramolecular TIM is greater than 300 Watts/meter-Kelvin (W/mK). According to some embodiments, the conductivity of the intramolecular TIM is about 10 to about 300 W/mK.

The coupling or cross-linking reaction occurs in the presence of a catalyst 120 in some embodiments. The type of catalyst depends on the types of compounds used for the first cross-linking functional group and the second cross-linking functional group. According to some embodiments, the first and second cross-linking functional groups react via an atom conservative "click" reaction. Generally, click reactions join a biomolecule and a reporter molecule, but is not limited to biological conditions. Click reactions are not disturbed by water and are characterized by a high thermodynamic driving force that drives the reaction quickly and irreversibly to a high yield of a single reaction product, with high reaction specificity, without formation of byproducts.

A non-limiting example of a click chemistry reaction that can be used include a copper-catalyzed reaction of an azide with an alkyne to form a reaction product of a 5-membered heteroatom ring (or heterocycle).

Depending on the type of chemistry used to form the cross-links, a catalyst 120 may or may not be included. A non-limiting example of a catalyst for click chemistry reactions are copper-based.

Figure 2:
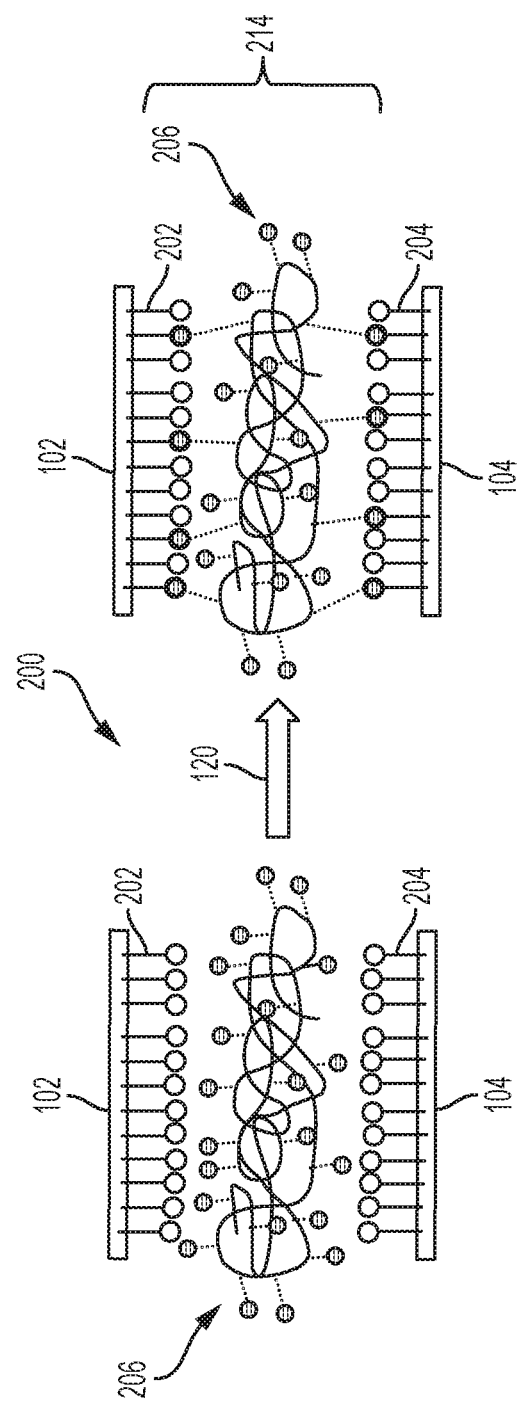
FIG. 2 illustrates another method of coupling surfaces with a cross-linked TIM according to embodiments of the invention.

FIG. 2 illustrates another method 200 of coupling surfaces with a cross-linked TIM according to embodiments of the invention. The cross-linked TIM is formed between a first surface 102 and a second surface 104. The first surface 102 includes a surface of a heat generating device, such as an electronic device, and the second surface 104 includes a surface of a heat sink.

A first surface binding cross-linker 202 is bonded to the first surface 102, and a second surface binding cross-linker 204 is bonded to the second surface 104. The first surface binding cross-linker 202 and the second surface binding cross-linker 204 each include a polymer that is functionalized with a functional group that can chemically bond to the respective first surface 102 and second surface 104. The type of functional group therefore depends on composition of the first and second surfaces 102, 104. The functional groups of the first surface binding cross-linker 202 and second surface bonding cross-linker 204 are the same in some embodiments, and different in other embodiments. Non-limiting examples of functional groups that can be used to bond to the first and second surfaces 102, 104 are discussed above with respect to FIG. 1, including, for example, thiols and silane coupling agents.

After the first and second surfaces 102, 104 are bonded to first surface binding cross-linker 202 and the second surface binding cross-linker 204, a polymer 206 that includes a cross-linking acceptor is then introduced and bonded to the first surface binding cross-linker 202 and the second surface binding cross-linker 204. The polymer 206 includes a polymeric backbone that is functionalized with a plurality of functional groups that can cross-link with and bind to the first surface binding cross-linker 202 and the second surface binding cross-linker 204. The functional groups are complementary to the functional groups of the first surface binding cross-linker 202 and the second surface binding cross-linker 204. The complementary functional groups bind to one another by cross-linking to the first surface binding cross-linker 202 to the second surface binding cross-linker 204 and form a cross-linked section 214 that creates an intramolecular TIM. A non-limiting example of a polymeric backbone that can be used for the polymer 206 includes functionalized poly(methyl methacrylates) (PMMA).

The coupling or cross-linking reaction may or may not occur in the presence of a catalyst 120. The type of catalyst depends on the complementary functional groups used for the polymer 206 and first and second surface binding cross-linkers 202, 204. According to some embodiments, the complementary functional groups react via an atom conservative click chemistry reaction, as discussed above. A non-limiting example of a catalyst 120 for a click chemistry reaction includes a metal-based catalyst, for example, copper-based catalysts.

Figure 3:
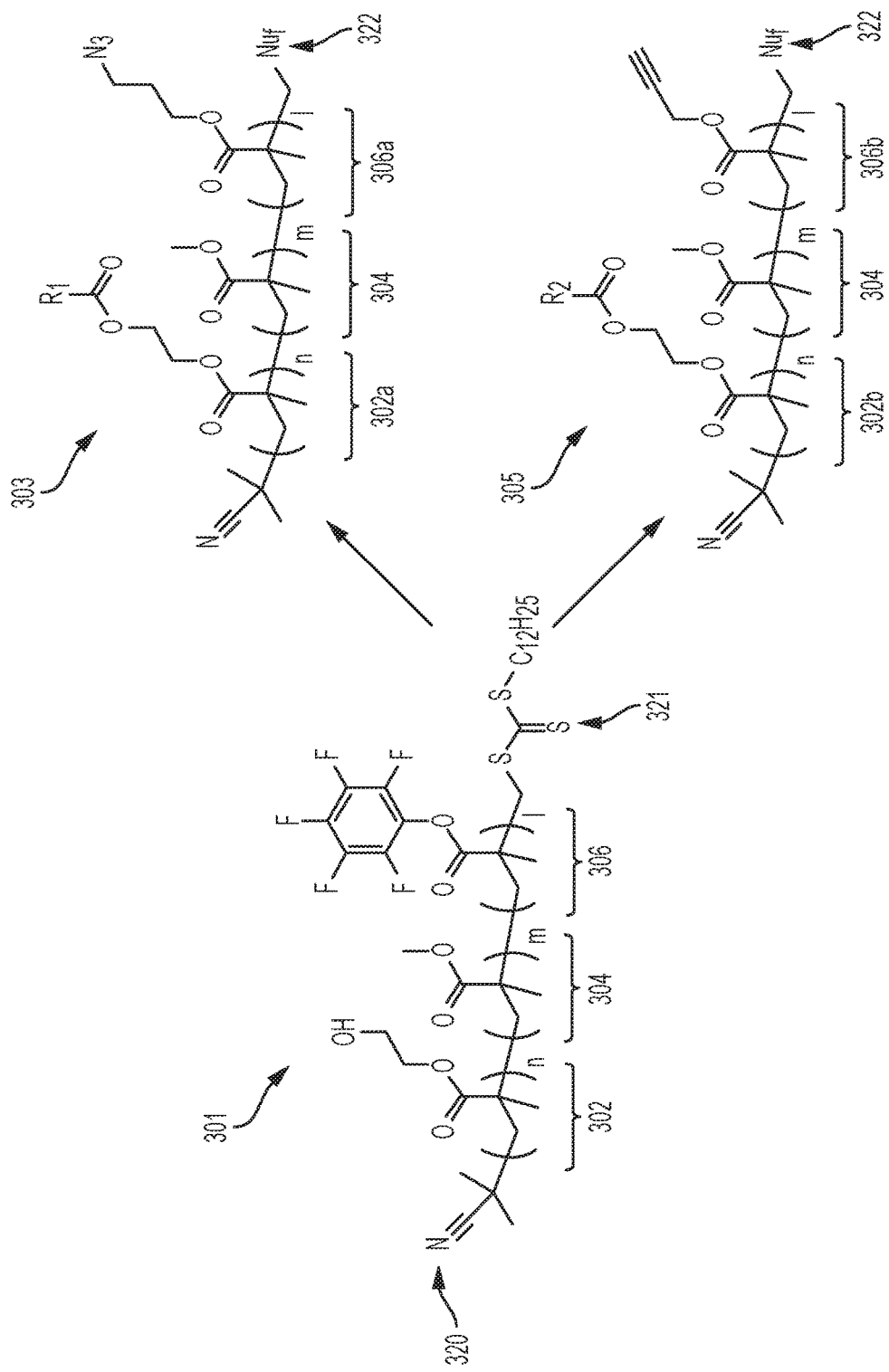
FIG. 3 illustrates a method of forming complementary surface binding polymers from a single polymeric precursor according to embodiments of the invention.

FIG. 3 illustrates a method of forming complementary surface binding polymers from a single polymeric precursor 301 according to embodiments of the invention. The polymeric precursor 301 includes a pre-surface binding block region 302 (able to be functionalized post-polymerization), a flexible block 304, a pre-cross-linker block region 306 (able to be functionalized post-polymerization), a first terminal end 320, and a second terminal end 321. The value of n, m, and l are tunable in the polymeric precursor 321 and depend on the particular application. According to one or more embodiments, the value of n, m, and l are each an integer in a range from about 1 to about 10,000. According to other embodiments, the values of n, m, and l are each an integer in a range from about 300 to about 2,000. Each of n, m, and l can be different values. The flexible block 304 includes PMMA. The surface binding block region 302 includes a polymeric backbone with a functional group that can be modified with one or more functional groups to form first surface binding polymer 303 and second surface binding polymer 305. The first terminal end 320 is nonreactive. The second terminal end 321 includes a trithiocarbonate group that facilitates polymerization according to some embodiments. Although, the first terminal end 320 can include any group that promotes polymerization.

The surface binding block region 302 of the polymeric precursor 301 is modified with a functional group $R_1$ that can bind to a first surface 102 (see FIG. 4) to form first surface binding block 302a of first surface binding polymer 303. The surface binding block region 302 of the polymeric precursor 301 is also modified with a functional group $R_2$ that can bind to a second surface 104 (see FIG. 4) to form second surface binding block 302b of second surface binding polymer 305. Cross-linker block region 306 of the polymeric precursor 301 is modified with complementary functional groups that will react to form a cross-linked TIM, forming first cross-linker block 306a and second cross-linker block 306b. The first cross-linker block 306a includes an azide functional group, and second cross-linker block 306b includes an alkyne functional group. The azide and the alkyne react via click chemistry to form a heterocylic reaction product. Once the azide containing functional group and the alkyne containing functional group are added as nucleophiles, the second terminal end 321 group is displaced with a nucleophile of functionalization 322.

Figure 4:
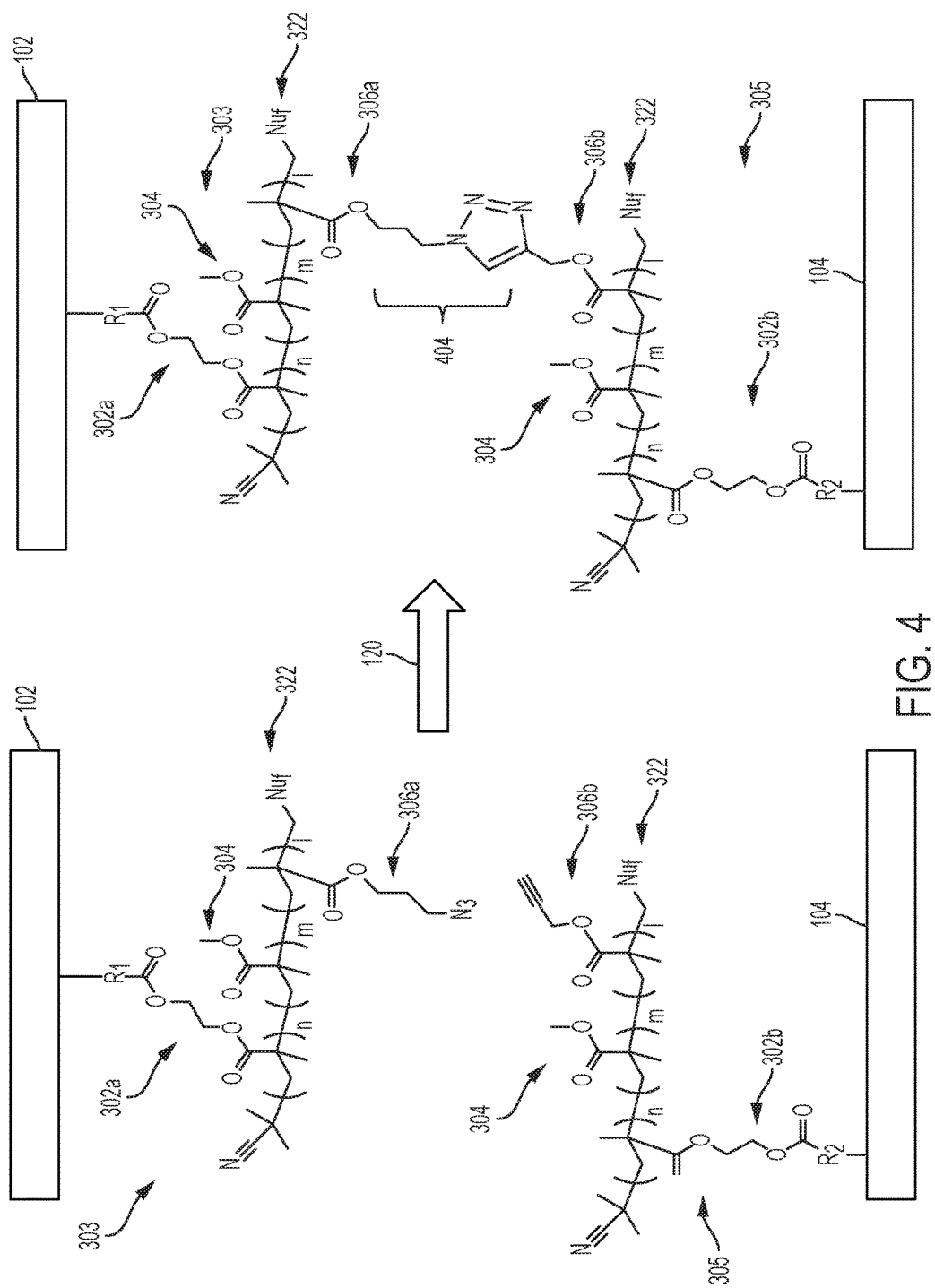
FIG. 4 illustrates a method of using the complementary surface bound polymers of FIG. 3 to form a cross-linked TIM according to embodiments of the invention.

FIG. 4 illustrates a method of using the complementary surface binding polymers of FIG. 3 to form a cross-linked TIM 404 according to embodiments of the invention. The azide and alkyne groups are complementary and react via a click chemistry reaction in the presence of a catalyst, in this case a copper-based catalyst, to form a cross-linked section 404, in particular a 5-membered heteroatom ring. Scheme 1 below represents the click chemistry reaction between the first surface binding polymer 303 and the second surface binding polymer 305:

Scheme 1

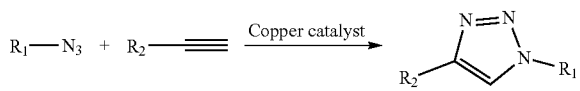

In Scheme 1, $R_1$ is the first surface binding polymer 303, and $R_2$ is a second surface binding polymer 305. Although $R_1$ and $R_2$ are shown as examples in FIG. 4, $R_1$ and $R_2$ can each be any polymer or copolymer that does not interrupt the reaction between the azide and the alkyne groups. Scheme 1, above, shows the cycloaddition yielding the more common 1,4-heterocyclic product, but it should be noted that the 1,5-product (where $R_2$ would be connected at the other carbon, 5 position) is also possible in small amounts in some embodiments. This regioselectivity will not drastically change the performance of the TIM.

The intramolecular TIMs described herein can be used in a variety of applications, including any electronics applications that need heat to be removed from a system. For example, the intramolecular TIMs can be used in electronics applications in the defense industry or computing, for example, light emitting diodes (LEDs), or organic light emitting diodes (OLEDs).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A thermal interface structure, comprising:
    a first surface comprising a surface of a heat generating device;
    a first surface binding polymer bonded to the first surface;
    a second surface comprising a surface of a heat sink; and
    a second surface binding polymer bonded to the second surface, the first surface binding polymer and the second surface binding polymer cross-linking to one another to form a covalently bonded cross-linked section that creates a thermal interface material that forms a continuous molecular connection between the first surface and the second surface.

2. The thermal interface structure of claim 1, wherein the heat generating device comprises an electronic device.

3. The thermal interface structure of claim 1, wherein:
    the first surface, the second surface, or both of the first surface and the second surface comprises gold; and
    the first surface binding polymer, the second surface binding polymer, or both the first surface binding polymer and the second surface binding polymer comprises a thiol.

4. The thermal interface structure of claim 1, wherein the first surface binding polymer, the second surface binding polymer, or both the first surface binding polymer and the second surface binding polymer comprises a silane coupling agent.

5. The thermal interface structure of claim 1, wherein the covalently bonded cross-linked section comprises a heterocycle.

6. The thermal interface structure of claim 1, wherein the first surface binding polymer and the second surface binding polymer each comprise poly(methyl methacrylate).

7. The thermal interface structure of claim 1, wherein the covalently bonded cross-linked section comprises a click chemistry reaction product.

8. A thermal interface structure, comprising:
    a first surface comprising a surface of a heat generating device;
    a first surface binding block copolymer bonded to the first surface, the first surface binding block copolymer comprising a first surface binding functional group bonded to the first surface and a first cross-linker block;
    a second surface comprising a surface of a heat sink; and
    a second surface binding block copolymer bonded to the second surface, the second surface binding block copolymer comprising a second surface binding functional group bonded to the second surface and a second cross-linker block, the first cross-linker block and the second cross-linker block cross-linking to one another to form a covalently bonded cross-linked section that forms a continuous molecular connection between the first surface and the second surface.

9. The thermal interface structure of claim 8, wherein the heat generating device comprises an electronic device.

10. The thermal interface structure of claim 8, wherein:
    the first surface, the second surface, or both of the first surface and the second surface comprises gold; and
    the first surface binding block copolymer, the second surface binding block copolymer, or both the first surface binding block copolymer and the second surface binding block copolymer comprises a thiol.

11. The thermal interface structure of claim 8, wherein the first surface binding block copolymer, the second surface binding block copolymer, or both the first surface binding block copolymer and the second surface binding block copolymer comprises a silane coupling agent.

12. The thermal interface structure of claim 8, wherein the covalently bonded cross-linked section comprises a heterocycle.

13. The thermal interface structure of claim 8, wherein the first surface binding block copolymer and the second surface binding block copolymer each comprises poly(methyl methacrylate).

14. The thermal interface structure of claim 8, wherein the covalently bonded cross-linked section comprises a click chemistry reaction product.

15. A method for forming a thermal interface material, the method comprising:
    bonding a first surface binding polymer to a first surface comprising a surface of a heat generating device;
    bonding a second surface binding polymer to a second surface comprising a surface of a heat sink; and
    reacting the first surface binding polymer with the second surface binding polymer to form a covalently bonded cross-linked section that forms a continuous molecular connection between the first surface and the second surface.

16. The method of claim 15, wherein the first surface binding polymer and the second surface binding polymer each comprises a block copolymer.

17. The method of claim 15, wherein:
    the first surface, the second surface, or both of the first surface and the second surface comprises gold; and
    the first surface binding polymer, the second surface binding polymer, or both comprises a thiol group.

18. The method of claim 15, wherein the covalently bonded cross-linked section comprises a click chemistry reaction product.

19. The method of claim 15, wherein the first surface binding polymer and the second surface binding polymer each comprises poly(methyl methacrylate).

20. The method of claim 15, wherein reacting the first surface binding polymer with the second surface binding polymer comprises a catalyst.

* * * * *